***(12)* United States Patent**
Lee et al.

(10) Patent No.: US 6,930,054 B2
(45) Date of Patent: Aug. 16, 2005

(54) SLURRY COMPOSITION FOR USE IN CHEMICAL MECHANICAL POLISHING OF METAL WIRING

(75) Inventors: Jae Seok Lee, Uiwang-Shi (KR); Won Joong Do, Uiwang-Shi (KR); Hyun Soo Roh, Gunpo-Shi (KR); Kil Sung Lee, Kwachon-Shi (KR); Jong Won Lee, Seongnam-Shi (KR); Bo Un Yoon, Seongnam-Shi (KR); Sang Rok Hah, Seoul (KR); Joon Sang Park, Seoul (KR); Chang Ki Hong, Gyeonggi-Do (KR)

(73) Assignees: Cheil Industries, Inc., Kumi-Shi (KR); Samsung Electronics Co., Ltd., Suwon-Shi (KR)

( * ) Notice: Subject to any disclaimer, the term of this patent is extended or adjusted under 35 U.S.C. 154(b) by 45 days.

(21) Appl. No.: 10/485,500
(22) PCT Filed: Aug. 6, 2002
(86) PCT No.: PCT/KR02/01492
  § 371 (c)(1),
  (2), (4) Date: Jul. 1, 2004
(87) PCT Pub. No.: WO03/015148
  PCT Pub. Date: Feb. 20, 2003

(65) Prior Publication Data
  US 2004/0244911 A1 Dec. 9, 2004

(30) Foreign Application Priority Data

Aug. 9, 2001 (KR) ...... 2001-0047895
May 21, 2002 (KR) ...... 10-2002-28052

(51) Int. Cl.$^7$ ............................ H01L 21/302
(52) U.S. Cl. ............ 438/745; 438/694; 438/692; 510/175; 510/312; 252/186.39; 252/186.38; 252/79.1
(58) Field of Search ............... 438/745, 694, 438/692; 252/186.39, 186.38, 79.1; 510/312, 175

(56) References Cited

U.S. PATENT DOCUMENTS

| | | |
|---|---|---|
| 3,438,811 A | 4/1969 | Harriman et al. |
| 3,597,290 A | 8/1971 | Naito et al. |
| 3,681,022 A | 8/1972 | Kibbel Jr. et al. |
| 3,877,938 A | 4/1975 | Shinozaki et al. |
| 3,962,005 A | 6/1976 | Lerner |
| 4,086,176 A | 4/1978 | Ericson et al. |

(Continued)

FOREIGN PATENT DOCUMENTS

| | | |
|---|---|---|
| EP | 0 332 050 A1 | 3/1989 |
| EP | 0 708 160 B1 | 4/1996 |

(Continued)

OTHER PUBLICATIONS

Basak et al., "Electrochemical Aspects of the Chemical Mechanical Planarization of Tungsten," Electrochemical Society Proceedings, Pennington, NJ, 1997, vol. 96–22, pp. 137–148.

Farkas et al, "Oxidation and Etching of Tungsten in CMP Slurries," Conference Proceedings USLI–X, 1995 Materials Research Society, pp. 25–32.

(Continued)

*Primary Examiner*—Matthew Smith
*Assistant Examiner*—Victor V Yevsikov
(74) *Attorney, Agent, or Firm*—Myers Bigel Sibley & Sajovec PA

(57) ABSTRACT

Disclosed herein are slurry compositions for use in CMP (chemical mechanical polishing) process of metal wiring in manufacturing semiconductor devices, comprising a peroxide, an inorganic acid, a propylenediaminetetraacetate (PDTA)-metal complex, a carboxylic acid, a metal oxide powder, and de-ionized water, wherein the PDTA-metal complex plays a major role in improving overall polishing performance and reproducibility thereof by preventing abraded tungsten oxide from readhesion onto the polished surface, as well as in improving the dispersion stability of the slurry composition.

18 Claims, 4 Drawing Sheets

U.S. PATENT DOCUMENTS

| | | | |
|---|---|---|---|
| 4,130,454 A | 12/1978 | Dutkewych et al. | |
| 4,140,646 A | 2/1979 | Kent et al. | |
| 4,144,119 A | 3/1979 | Dutkewych et al. | |
| 4,297,436 A | 10/1981 | Kubotera et al. | |
| 4,305,779 A | 12/1981 | Steeves et al. | |
| 4,405,571 A | 9/1983 | Vadasdi et al. | |
| 4,444,601 A | 4/1984 | Greene | |
| 4,448,634 A | 5/1984 | Lampert | |
| 4,885,106 A | 12/1989 | Lapham et al. | |
| 4,954,142 A | 9/1990 | Carr et al. | |
| 4,956,015 A | 9/1990 | Okajima et al. | |
| 4,956,313 A | 9/1990 | Cote et al. | |
| 4,959,113 A | 9/1990 | Roberts | |
| 5,084,071 A | 1/1992 | Nenadic et al. | |
| 5,102,499 A | 4/1992 | Jodgens et al. | |
| 5,200,166 A | 4/1993 | Shiga et al. | |
| 5,209,816 A | 5/1993 | Yu et al. | |
| 5,225,034 A | 7/1993 | Yu et al. | |
| 5,244,534 A | 9/1993 | Yu et al. | |
| 5,256,402 A | 10/1993 | Prencipe et al. | |
| 5,340,370 A | 8/1994 | Cadien et al. | |
| 5,354,490 A | 10/1994 | Yu et al. | |
| 5,391,258 A | 2/1995 | Brancaleoni et al. | |
| 5,403,779 A | 4/1995 | Joshi et al. | |
| 5,407,526 A | 4/1995 | Danielson et al. | |
| 5,418,115 A | 5/1995 | Tsubai et al. | |
| 5,516,346 A | 5/1996 | Cadien et al. | |
| 5,527,423 A | 6/1996 | Neville et al. | |
| 5,534,462 A | 7/1996 | Fiordalice et al. | |
| 5,538,152 A | 7/1996 | Fontana | |
| 5,575,837 A | 11/1996 | Kodama et al. | |
| 5,575,885 A | 11/1996 | Hirabayashi et al. | |
| 5,612,250 A | 3/1997 | Ohtani et al. | |
| 5,662,769 A | 9/1997 | Schonauer et al. | |
| 5,709,593 A | 1/1998 | Guthrie et al. | |
| 5,746,606 A | 5/1998 | Sobbani | |
| 5,770,095 A | 6/1998 | Sasaki et al. | |
| 5,783,489 A | 7/1998 | Kaufman et al. | |
| 5,800,577 A | 9/1998 | Kido | |
| 5,804,513 A | 9/1998 | Sakatani et al. | |
| 5,846,398 A | 12/1998 | Carpio | |
| 5,854,096 A | 12/1998 | Ohtani et al. | |
| 5,858,813 A | 1/1999 | Scherber et al. | |
| 5,863,838 A | 1/1999 | Farkas et al. | |
| 5,876,625 A * | 3/1999 | Collins et al. | 252/186.33 |
| 5,916,011 A | 6/1999 | Kim et al. | |
| 5,916,855 A | 6/1999 | Avanzino et al. | |
| 5,922,091 A | 7/1999 | Tsai et al. | |
| 5,948,697 A | 9/1999 | Hata | |
| 5,958,288 A | 9/1999 | Mueller et al. | |
| 5,980,775 A | 11/1999 | Grumbine et al. | |
| 5,993,686 A | 11/1999 | Streinz et al. | |
| 6,015,506 A | 1/2000 | Streinz et al. | |
| 6,030,425 A | 2/2000 | Hata | |
| 6,068,787 A | 5/2000 | Grumbine et al. | |
| 6,183,665 B1 * | 2/2001 | Blondeau et al. | 252/186.39 |
| 6,258,140 B1 | 7/2001 | Shemo et al. | |
| 6,364,919 B1 | 4/2002 | Lee et al. | |
| 6,447,694 B1 | 9/2002 | Lee et al. | |
| 6,488,730 B2 | 12/2002 | Lee et al. | |
| 6,514,352 B2 | 2/2003 | Gotoh et al. | |
| 6,527,622 B1 | 3/2003 | Brusic et al. | |
| 6,551,367 B2 | 4/2003 | Lee et al. | |
| 6,551,935 B1 | 4/2003 | Sinha et al. | |
| 6,604,987 B1 | 8/2003 | Sun | |
| 6,632,377 B1 | 10/2003 | Brusic et al. | |
| 6,653,242 B1 | 11/2003 | Sun et al. | |
| 6,689,258 B1 | 2/2004 | Lansford et al. | |
| 6,716,755 B2 | 4/2004 | Fang et al. | |
| 6,721,628 B1 | 4/2004 | Lai et al. | |
| 6,722,950 B1 | 4/2004 | Dabral et al. | |
| 6,733,553 B2 | 5/2004 | Kido et al. | |
| 6,739,951 B2 | 5/2004 | Sun et al. | |
| 2002/0061635 A1 | 5/2002 | Lee et al. | |
| 2002/0066465 A1 * | 6/2002 | Gotoh et al. | 134/2 |
| 2002/0145127 A1 | 10/2002 | Kaufman et al. | |
| 2003/0027499 A1 | 2/2003 | Fang et al. | |
| 2003/0060135 A1 | 3/2003 | Moeggenborg et al. | |
| 2003/0077985 A1 | 4/2003 | Zhou et al. | |
| 2003/0080319 A1 * | 5/2003 | Annen et al. | 252/186.1 |
| 2003/0082998 A1 | 5/2003 | Carter et al. | |
| 2003/0124959 A1 | 7/2003 | Schroeder et al. | |
| 2003/0134575 A1 | 7/2003 | Fang | |
| 2003/0143848 A1 | 7/2003 | Steckenrider et al. | |
| 2003/0166337 A1 | 9/2003 | Wang et al. | |
| 2003/0168628 A1 | 9/2003 | Vacassy | |
| 2003/0181142 A1 | 9/2003 | De Rege Thesauro et al. | |
| 2003/0203635 A1 | 10/2003 | Wang et al. | |
| 2003/0209522 A1 | 11/2003 | Grumbine et al. | |
| 2003/0211815 A1 | 11/2003 | Carter et al. | |
| 2003/0226998 A1 | 12/2003 | Grumbine | |
| 2003/0228763 A1 | 12/2003 | Schroeder et al. | |
| 2004/0009671 A1 | 1/2004 | Kaufman et al. | |
| 2004/0082276 A1 | 4/2004 | Prasad | |

FOREIGN PATENT DOCUMENTS

| | | |
|---|---|---|
| EP | 0 826 756 A2 | 3/1998 |
| EP | 0 846 742 A2 | 6/1998 |
| EP | 0 844 290 B1 | 3/2002 |
| JP | 04-275387 | 9/1992 |
| JP | 10-44047 A | 2/1998 |
| KR | 2001-109960 A | 12/2001 |
| WO | WO97/43087 A1 | 11/1997 |
| WO | WO98/23408 A1 | 6/1998 |
| WO | WO98/23697 A1 | 6/1998 |
| WO | WO99/53532 | 10/1999 |
| WO | WO03/15148 A1 | 2/2003 |

OTHER PUBLICATIONS

Kaufman et al., "Chemical–Mechanical Polishing for Fabricating Patterned W Metal Features as Chip Interconnects," J. Electrochem. Soc., vol. 138, No. 11, Nov. 1991, pp. 3460–3464.

M.R. Oliver, "Chemical–Mechanical Planarization of Semiconductor Materials," Oct. 2003, Chapter 2, pp. 7–40.

M.R. Oliver, "Chemical–Mechanical Planarization of Semiconductor Materials," Oct. 2003, Chapter 3, pp. 41–83.

M.R. Oliver, "Chemical–Mechanical Planarization of Semiconductor Materials," Oct. 2003. Chapter 4, pp. 85–132.

M.R. Oliver, "Chemical–Mechanical Planarization of Semiconductor Materials," Oct. 2003, Chapter 7, pp. 215–249.

Raghunath et al., "Mechanistic Aspects of Chemical Mechanical Polishing of Tungsten Using Ferric Ion Based Alumina Slurries," Electrochemical Society Proceedings, Pennington, NJ, 1997, vol. 96–22, pp. 1–15.

Steigerwald et al. "Chemical Mechanical Planarization of Microelectronic Materials," 1997, Chapter 4, pp. 48–128.

Steigerwald et al. "Chemical Mechanical Planarization of Microelectronic Materials," 1997, Chapter 6, pp. 181–208.

Stein et al., "In Situ Electrochemical Investigation of Tungsten Electrochemical Behavior during Chemical Mechanical Polishing," J. Electrochem. Soc., vol. 145, No. 9, Sep. 1998, pp. 3190–3196.

Streinz et al., "An Electrochemical Approach to Slurry Characterization and Development for W CMP," Electrochemical Society Proceedings, Pennington, NJ, 1997, vol. 96–22, pp. 159–175.

* cited by examiner

SLURRY COMPOSITION FOR USE IN CHEMICAL MECHANICAL POLISHING OF METAL WIRING

CROSS REFERENCE TO A RELATED APPLICATION

This application is a National Stage Application of International Application Number PCT/KR02/01492, published, pursuant to PCT Article 21(2); which claims priority to Korean Application No. 2001-47895, filed Aug. 9, 2001 and Korean Application No. 2002-28052, file May 21, 2002.

TECHNICAL FIELD

The present invention relates, in general, to a slurry composition for use in chemical mechanical polishing (CMP) processes in manufacturing semiconductor devices, in detail, to a CMP slurry composition for planarization of tungsten layer of device wafers.

BACKGROUND ART

Metals including tungsten have diverse applicability in manufacturing integrated circuits. For example, metal layers can be formed to interconnect numerous conductive devices positioned on a siliconwafer or to constitute them. Currently, integrated circuits are produced by mounting appropriate devices such as a diode and a transistor on and/or in a siliconwafer. At this time, processes for forming separate layers of insulating material and conductive material throughout the surface of the device are repeated. In an integrated circuit, characteristics of a contact hole or via depend on the nature of the insulating material, and the via is filled with conductive materials so as to provide a vertical contact that penetrates the insulating material and contacts appropriate parts of the devices mounted on the wafer. While aluminum is useful as a wiring material, it is inadequate to fill the inside of a via completely. Typically, a via is filled with tungsten that can be adapted to a CVD (chemical vapor deposition) process. In the course of chemical vapor deposition, tungsten not only fills the via also covers the surface of the insulating layer. Following the elimination of the excess of tungsten, aluminum wiring is then formed on the dielectric layer and the via.

Previously, a RIE (reactive ion etching) process was employed in the tungsten-elimination step in conventional semiconductor processes. However, the RIE process has critical shortcomings in that it is apt to overetch the tungsten layer to partially etch even the tungsten in the via, resulting in poor contact with the aluminum wiring formed on the tungsten layer. Furthermore, any tungsten particles remaining on the wafer can cause fatal inferiority in the resulting semiconductor integrated circuit. It is the CMP(chemical mechanical polishing) process that has been developed to solve these problems with the RIE process.

The CMP process has come to be introduced in the art according to the increase of integrity and the number of layers of the semiconductor integrated circuits. In the CMP process, a semiconductor wafer is subjected to orbital movement combining rotation and translation while contacted with a polishing pad made of polyurethane and with a slurry composition comprising abrasives and various other compounds, to planarize the surface of the wafer. Generally, slurry compositions used in such CMP process (hereinafter, referred to as 'CMP slurry') provides both chemical and mechanical polishing effects, while etchants, oxidants, acids, and dispersing agents being in charge of the chemical polishing function and abrasives, micro-particles of metal oxides being in charge of the mechanical polishing function. These two polishing functions allow any protrusion of the outer surface of the wafer to be selectively etched and polished, resulting in the best planarization of the wafer.

According to the polishing substrate, CMP slurry can be classified into oxide-polishing slurry for insulating layers such as $SiO_2$ layer and metal-polishing slurry for metal layers such as tungsten or aluminum layer. These two classes of CMP slurry are discriminated in the components exerting the chemical polishing function.

Meanwhile, the conventional metal-polishing CMP slurry has the typical problems represented by the oxide erosion due to the difference of polishing rate among a metal, a barrier metal and a dielectric layer, and the corrosion due to the excessive etch of metal layers by oxidant ingredients. If the erosion or the corrosion occurs during CMP process, contact with another metal layer deposited on the polished metal layer comes to be poor, so that the resulting semiconductor integrated circuit may not work normally. These problems are considered to arise mainly from the excessive oxidizing power of the oxidants contained in the polishing slurry. Up to date, polishing rate required for the conventional semiconductor processes has been accomplished primarily by increasing either the amount or the strength of oxidants added to a CMP slurry. Consequently, oxide erosion, corrosion, pit, dishing and so on were inevitably caused. Such oxide erosion and corrosion are schematically illustrated in FIGS. 1a and 1b, respectively.

Moreover, a metal CMP slurry is prepared in an acidic condition for the purpose of vigorous polishing of tungsten, and at such low pH usually decreases the dispersability of abrasive particles, which results in significant deterioration of the reproducibility of polishing performance of a slurry.

SUMMARY OF THE INVENTION

The present invention concerns the discovery that the addition of a propylenediaminetetraacetate-metal complex and carboxylic acid to a non-selective, metal CMP slurry containing a little amount of peroxide and inorganic acid as oxidants can considerably improve the polishing rate, the within-wafer nonuniformity, and the wafer-to-wafer nonuniformity, as well as the dispersion stability of the slurry.

The present invention features a slurry composition for use in chemical mechanical polishing of metal, the composition essentially consisting of a peroxide, an inorganic acid, a propylenediaminetetraacetate-metal complex, a carboxylic acid, and a metal oxide powder.

In a preferred embodiment of the present invention, a CMP slurry composition is prepared by dispersing in deionized water (i) a peroxide and an inorganic acid that act as a mild oxidant in combination, (ii) a metal complex containing propylenediaminetetraacetate ligand that prevents abraded tungsten oxide particles from the re-adhesion to the polished surface and improves the dispersion stability, (iii) a carboxylic acid that is helpful in improving reproducibility of polishing performance and dispersion stability, and (iv) a metal oxide powder that acts as an abrasive.

All of the above features and other features of the present invention will be successfully achieved from the present invention described in the following.

DISCLOSURE OF THE INVENTION

Figure 1A:
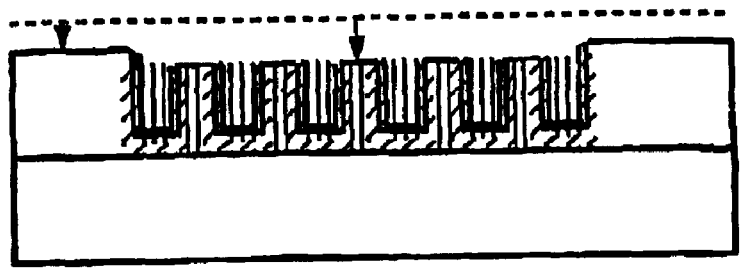
FIGS. 1a and 1b are schematic representations illustrating the oxide erosion and the corrosion, respectively, in CMP process of a metal layer.
Figure 1B:
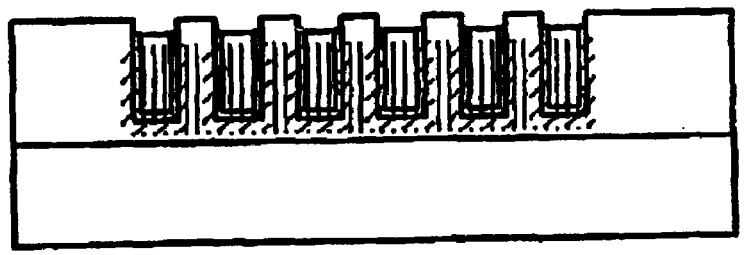

In the present invention, as an oxidant for oxidizing metal substrate to be polished are preferred peroxides such as hydrogen peroxide, benzoyl peroxide, calcium peroxide, barium peroxide and sodium peroxide, and most preferably is used hydrogen peroxide considering oxidizing power and dispersion stability of the resulting slurry. Hydrogen peroxide has a relatively high oxidation potential, but oxidation rate is so low as to avoid the various problems with a strong oxidant unless it is not used in an excessive amount. Preferably, the slurry composition of the present invention contains 0.5~5 wt % of the peroxide.

To complement the oxidizing power of the slurry, at least one inorganic acid is used in addition to the peroxide. Preferable inorganic acid can be exemplified by nitric acid, sulfuric acid, hydrochloric acid and phosphoric acid. Regarding the surface contamination after polishing, nitric acid is most preferred. In the present invention, the inorganic acid also functions as a pH-controlling agent to facilitate the oxidation of tungsten. The content of inorganic acid in a slurry composition of the present invention is preferably 0.001~5.0 wt %, more preferably 0.001~3.0 wt %.

In the case that these two types of oxidant, i.e., the peroxide and the inorganic acid, are added over the upper limits of the above mentioned ranges, respectively, the oxide erosion, corrosion, pit, dishing and so on are likely to occur, and in the opposite case, desired polishing rate can not be accomplished.

Typically, CMP slurry compositions comprising the small amount of mild oxidants such as peroxide and inorganic acid can polish a metal layer and a barrier layer(primarily, a Ti/TiN layer) at sufficiently similar rates to prevent oxide erosion, but they would be improper to the conventional semiconductor processes due to the excessively low polishing rate. Though the addition of excessive oxidants could improve the polishing rate, it would cause various problems including the oxide erosion and the corrosion and further make the handling of the slurry difficult because of the strong acidity. Alternative to this approach, we employ specific metal complexes to efficiently achieve the polishing rate required for semiconductor processes. The metal complexes consists of a propylenediaminetetraacetate (PDTA) ligand and a metal (M) atom, wherein bond energy of O-M is lower than that of O—W. Hereinafter, such metal complexes are referred to as 'PDTA-M complex', or shortly 'PDTA-M'.

The probable mechanism by which the PDTA-M complex enhances the polishing rate could be explained as follows: the PDTA ligand forms a complex with tungsten oxide, $W_xO_y$, which was abraded from an oxidized tungsten layer during CMP process, and removes them from the reaction system, facilitating the oxidation reaction of the tungsten layer. Usually, however powerful oxidant may be used, it cannot overcome the decrease of polishing rate resulted from the accumulation of abraded metal oxide according to the progress of polishing, because the metal oxide inhibits the polishing by re-adhering onto the surface of the metal layer to be polished. The present invention aims to solve this re-adhesion problem. The PDTA ligand is a multidentate ligand, which has four ligand atoms and thus easily forms a chelate, PDTA-M. Advantageously, by selecting the metal atom so that the bond energy of O-M is lower than that of O—W, the PDTA-M complex can be spontaneously converted into PDTA-W complex during polishing process. For example, in the case of PDTA-Fe complex, the bond energy of O—Fe is 93.3kcal/mol while that of O—W being 160kcal/mol, and therefore the Fe atom coordinated to the PDTA ligand can be easily replaced with a W atom, that is, the PDTA-Fe complex is converted into a PDTA-W complex. Thus, by use of the PDTA-M complex, the re-adhesion of tungsten oxide is efficiently blocked, and therefore the reproducibility of polishing performance including polishing rate as well as selectivity are also improved.

Figure 2:
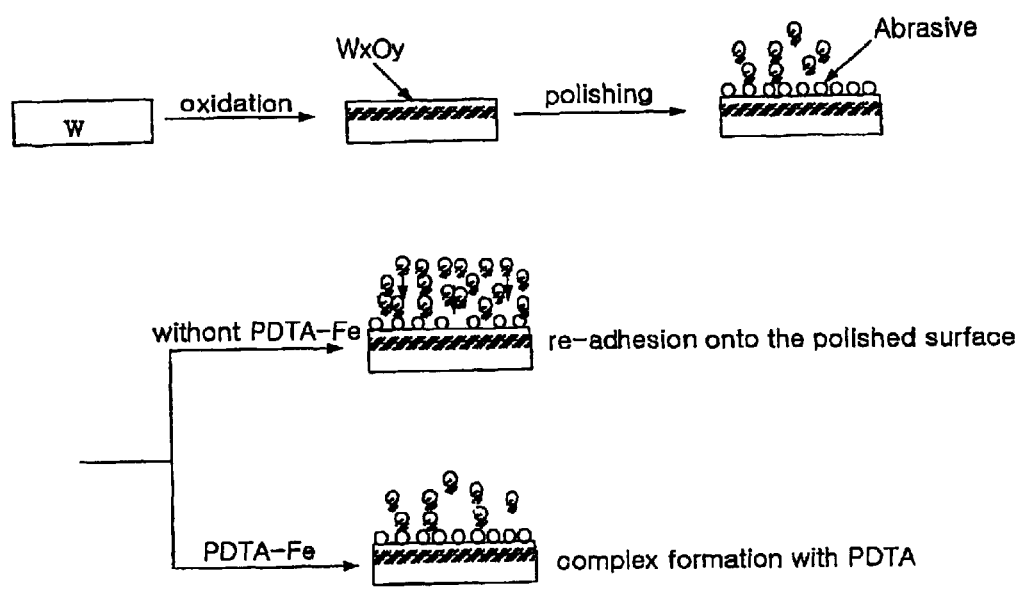
FIG. 2 is a schematic representation illustrating the working mechanism of PDTA-Fe in W-CMP process using a slurry composition according to the present invention.

While PDTA-Fe complex are most preferable in terms of the cost and the efficiency of absorption of the polished metal oxide, any metal atom can be substituted for Fe atom so long as it can form coordination bonds with the PDTA ligand and binds to oxygen atom more weakly than tungsten atom does. Non-limiting examples of such PDTA-metal complex include PDTA-Ni and PDTA-Co. FIG. 2 schematically illustrates the working mechanism of PDTA-Fe complex during polishing of a tungsten layer using a slurry composition of the present invention.

Moreover, the PDTA-M complex improves the storage stability of a slurry composition of the present invention so that the polishing performance represented by scratch and polishing rate is reproducible after a long lapse of time. Where silica powder is added to a slurry composition as an abrasive, the dispersability of silica is certain to significantly decrease at an acidic pH required for usual metal polishing processes because the isoelectric point of silica has the smallest absolute value over pH 2~4. Therefore, as time lapses, re-coagulation of the silica particles progresses spontaneously to form macro-aggregates, resulting in precipitation and scratch. The PDTA-M complex prevents such coagulation of abrasive particles including silica so that the long-term storage stability of a slurry composition of the present invention is enhanced.

To a slurry composition of the present invention is preferably added the PDTA-M complex in an amount of 0.001~0.5 wt %, more preferably 0.05~0.3 wt %. If excessive PDTA-M complex is added, metallic impurities increase in a slurry composition and thus the reliability of the resulting semiconductor products would be deteriorated. On the other hand, if the PDTA-M complex is deficient, the efficiency of capturing tungsten oxide as well as of stabilizing dispersability of abrasives declines.

Where hydrogen peroxide is used as an oxidant as in the present invention, the oxidizing power of a slurry composition becomes lower depending on time due to the decomposition of hydrogen peroxide into $O_2$ and $H_2O$. Based on this observation, we use at least one carboxylic acid having one or more carboxylic groups to further enhance the reproducibility of polishing performance and the storage stability of a slurry composition of the present invention. Non-limiting examples of such carboxylic acid include acetic acid, citric acid, glutaric acid, glycolic acid, formic acid, lactic acid, malic acid, maleic acid, oxalic acid, phthalic acid, succinic acid, and tartaric acid, while malic acid being most preferred. The content of carboxylic acid in a slurry composition of the present invention is preferably 0.1~0 wt %, more preferably 0.1~2 wt %. Excessive carboxylic acid over 10 wt % may rather reduce the dispersion stability of a slurry composition, while the desired effect cannot be obtained with an insufficient amount of carboxylic acid.

In the present invention, as an abrasive for polishing tungsten film oxidized by the oxidants as described above can be used a powder of metal oxide such as silica, alumina, ceria and titania, and the silica is most preferred because it gives the excellent dispersability and the least possibility of scratches. Preferably, the metal oxide powder amounts to 0.1~10 wt %, more preferably 1~7 wt % in a slurry composition of the present invention. If it is over 10 wt %, the dispersion stability of a slurry composition becomes poor and furthermore the scratches and the oxide erosion may occur, and if it is below 0.1 wt %, the polishing rate appropriate to the usual semiconductor processes cannot be achieved.

The present invention can be more clearly understood with referring to the following examples. It should be understood that the following examples are not intended to restrict the scope of the present invention in any manner. The polishing performance of the respective slurry compositions obtained from each example was estimated as follows:

Polisher: Model No. 6EC (STRASBAUGH, USA)
Polishing Condition:
  Pad type: IC1400/SubaIV Stacked (Rodel, USA)
  Platen speed: 75 rpm
  Quill speed: 35 rpm
  Pressure: 4 psi
  Back pressure: 0 psi
  Temperature: 25 ° C.
  Slurry flow: 250 ml/min
Polishing Substrates: As test wafers were used W blanket wafers, each of which had been prepared by sequentially depositing 1,000 Å HTO layer, 1,000 Å TiN layer and 10,000 Å W layer on a poly-Si wafer.

EXAMPLE 1

Dependence of Polishing Rate on the Added Amount of PDTA-Fe

Figure 3:
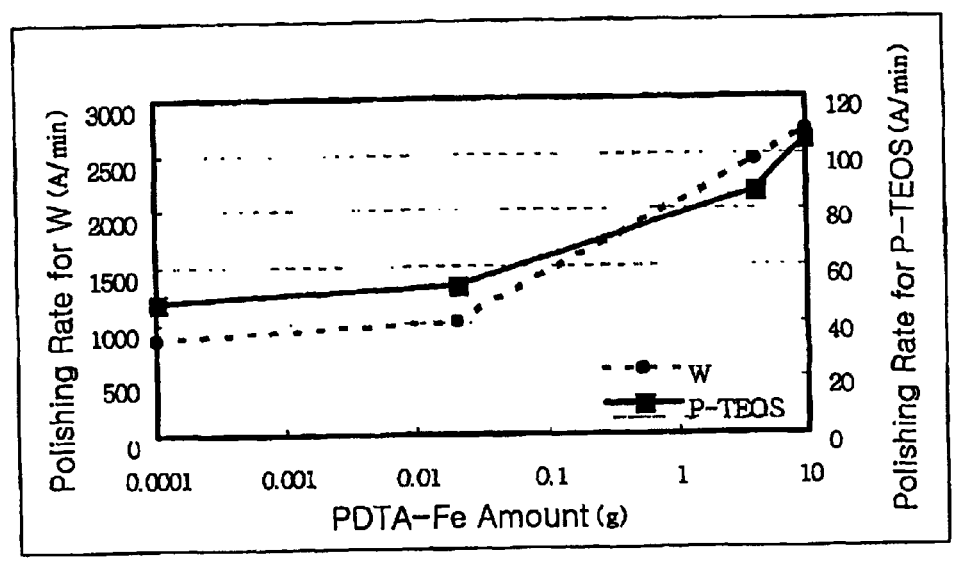
FIG. 3 is a graph illustrating the dependence of polishing rate on the added amount of PDTA-Fe.

To a flask were added 50 g of Aerosil 90G(Degussa AG, Germany), 917.5 g of de-ionized water, 10.0 g of malic acid, 0.3 g of nitric acid, and 20.0 g of hydrogen peroxide, and then stirred at 2,000 rpm for 2 hours, followed by high-pressure dispersion under the pressure of 1,200 psi. The resulting slurry was filtered through a 1 μm filter, and 0.0 g, 0.02 g, 4.0 g or 10.0 g of PDTA-Fe was added thereto, to provide polishing slurry compositions. Polishing of the test wafers(W blanket wafers) was conducted using the respective slurry compositions for 2 minutes under the condition as described above. The results are set forth in Table 1 and FIG. 3.

TABLE 1

| Slurry | PDTA-Fe | Polishing Rate for W* | Polishing Rate for P-TEOS** |
|---|---|---|---|
| I | 0.0 g | 863 Å/min | 48 Å/min |
| II | 0.02 g | 1,006 Å/min | 53 Å/min |
| III | 4.0 g | 2,445 Å/min | 87 Å/min |
| IV | 10.0 g | 2,718 Å/min | 105 Å/min |

*W: tungsten
**P-TEOS: poly-tetraorthosilicate

EXAMPLE 2

Effect of PDTA-Fe on the Oxide Erosion and the Corrosion

The slurry III of the above Example 1, and other slurry compositions having the same composition as the slurry III with the exception that Fe (NO$_3$)$_3$ or KIO$_3$ was substituted for PDTA-Fe were used, respectively, for polishing patterned wafers having the line width of 0.2 μm under the condition as described above. The results are set forth in Table 2.

TABLE 2

| Sample | PDTA-Fe | Fe(NO$_3$)$_3$ | KIO$_3$ | Polishing Rate for W | Ozide Erosion | Corrosion Rate |
|---|---|---|---|---|---|---|
| 1 | 4.0 g | 0.0 g | 0.0 g | 2,486 Å/min | 65 Å | 10 Å/min |
| 2 | 0.0 g | 15.0 g | 0.0 g | 2,445 Å/min | 460 Å | 120 Å/min |
| 3 | 0.0 g | 0.0 g | 20.0 g | 2,718 Å/min | 328 Å | 150 Å/min |

EXAMPLE 3

Figure 4:
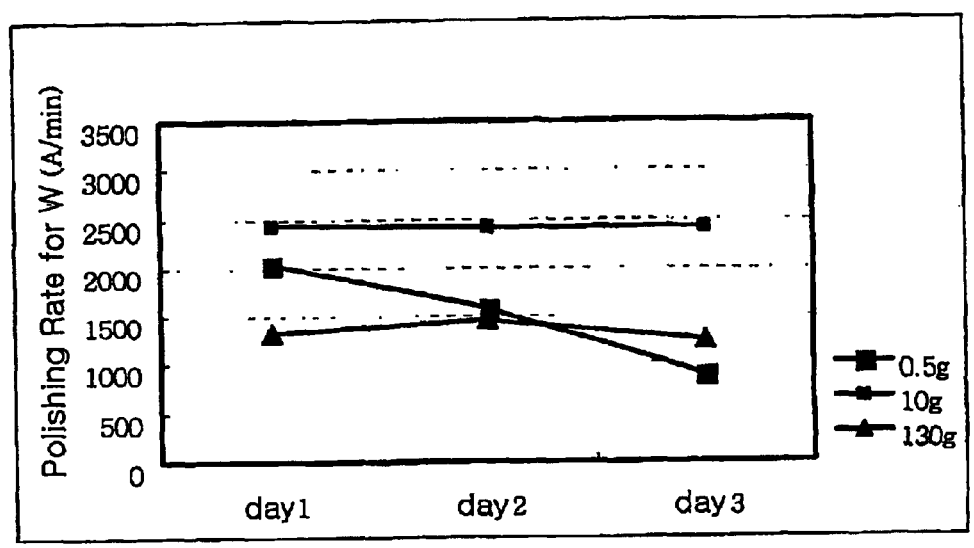
FIG. 4 is a graph illustrating the dependence of polishing reproducibility on the added amount of malic acid.

Dependence of Reproducibility of Polishing Performance on the Added Amount of Malic Acid A series of slurry compositions was prepared according to the same manner as in the preparation of the slurry III of the above Example 1 with the exception of varying the amount of malic acid. Polishing of test wafers (W blanket wafers) was conducted using the respective slurry compositions for 2 minutes under the condition as described above. The results are shown in FIG. 4.

EXAMPLE 4

Effect of PDTA-Fe on the Dispersion Stability of a Slurry Composition

The slurry III of the above Example 1, and a control slurry composition having the same composition as the slurry III with the exception of lack of PDTA-Fe were subjected to the polishing test as described above on day 0, 30, 60, and 120 after the preparation thereof. The results are set forth in Table 3 together with the mean particle size of the respective slurry compositions, which was measured by means of ELS 8000(Ostuka Co., Japan).

TABLE 3

| Sample | PDTA-Fe | Day after Preparation | Polishing Rate for W | Mean Particle Size |
|---|---|---|---|---|
| 1 | 0.0 g | 0 | 863 Å/min | 185 nm |
| 2 | 4.0 g | 0 | 2,445 Å/min | 185 nm |
| 3 | 0.0 g | 30 | 425 Å/min | 210 nm |
| 4 | 4.0 g | 30 | 2,375 Å/min | 186 nm |
| 5 | 0.0 g | 60 | 388 Å/min | 248 nm |
| 6 | 4.0 g | 60 | 2,485 Å/min | 188 nm |
| 7 | 0.0 g | 120 | 376 Å/min | 447 nm |
| 8 | 4.0 g | 120 | 2,418 Å/min | 188 nm |

EXAMPLE 5

Dependence of Polishing Performance on the Added Amount of Hydrogen Peroxide and Nitric Acid A series of slurry compositions was prepared according to the same manner as in the preparation of the slurry III of the above Example 1 with the exception of varying the amount of hydrogen peroxide or nitric acid. Polishing of patterned wafers having the line width of 0.2 μm was conducted using the respective slurry compositions for 2 minutes under the condition as described above. The results are set forth in Table 4.

TABLE 4

| Sample | Hydrogen Peroxide | Nitric Acid | Polishing Rate for W | Corrosion Rate | Oxide Erosion |
|---|---|---|---|---|---|
| 1 | 20 g | 0.3 g | 2,486 Å/min | 10 Å/min | 85 Å |
| 2 | 60 g | 0.3 g | 3,253 Å/min | 130 Å/min | 684 Å |
| 3 | 2 g | 0.3 g | 637 Å/min | 4 Å/min | 62 Å |
| 4 | 20 g | 0.005 g | 1,204 Å/min | 5 Å/min | 47 Å |
| 5 | 20 g | 0.8 g | 2,765 Å/min | 8 Å/min | 116 Å |

As stated above, by virtue of the present invention, it has become possible to accomplish the optimum polishing rate in CMP processes without typical problems such as oxide erosion, corrosion, pit, dishing and so on. Further, the slurry compositions of the present invention have been so improved in the dispersion stability that they are suitable for long-term storage.

The simple modification and change of the present. invention will be readily made by persons skilled in the art and it should be understood that all of such modification and change are encompassed within the scope of the present invention.

What is claimed is:

1. A slurry composition for use in chemical mechanical polishing of metal, comprising a peroxide, an inorganic acid, a PDTA (propylenediaminetetraacetate)-metal complex, a carboxylic acid, a metal oxide powder, and de-ionized water.

2. The composition according to claim 1, wherein the composition comprises 0.5~5 wt % of the peroxide, 0.00~5.0 wt % of the inorganic acid, 0.001~0.5 wt % of the PDTA-metal complex, 0.1~10 wt % of the carboxylic acid, and 0.1~10 wt % of the metal oxide powder.

3. The composition according to claim 2, wherein PDTA-metal complex content of the composition is 0.05~0.3 wt %.

4. The composition according to claim 1, wherein the peroxide is one or more selected from the group consisting of hydrogen peroxide, benzoyl peroxide, calcium peroxide, barium peroxide, and sodium peroxide.

5. The composition according to claim 1, wherein the inorganic acid is one or more selected from the group consisting of nitric acid, sulfuric acid, hydrochloric acid, and phosphoric acid.

6. The composition according to claim 1, wherein the PDTA-metal complex is PDTA-Fe, PDTA-Ni, or PDTA-Co.

7. The composition according to claim 1, wherein the carboxylic acid is one or more selected from the group consisting of acetic acid, citric acid, glutaric acid, glycolic acid, formic acid, lactic acid, malic acid, maleic acid, oxalic acid, phthalic acid, succinic acid, and tartaric acid.

8. The composition according to claim 1, wherein the metal oxide is silica, alumina, ceria, titania, or mixtures thereof.

9. A slurry precursor composition for chemical-mechanical polishing of metal layers on semiconductor substrates, comprising a pH-controlling agent, an abrasive, a metal-propylenediaminetetraacetate (M-PDTA) complex and deionized water.

10. The precursor composition of claim 9, further comprising a carboxylic acid.

11. The precursor composition of claim 10, wherein the pH controlling agent comprises nitric acid.

12. The precursor composition of claim 11, wherein the M-PDTA complex is Fe-PDTA.

13. A slurry precursor composition for chemical-mechanical polishing of metal layers on semiconductor substrates, comprising nitric acid, malic acid, an abrasive, a Fe-propylenediaminetetraacetate (Fe-PDTA) complex and deionized water.

14. A slurry composition for chemical-mechanical polishing of metal layers on semiconductor substrates, comprising hydrogen peroxide, a pH-controlling agent, an abrasive, a metal-propylenediaminetetraacetate (M-PDTA) complex and deionized water.

15. The slurry composition of claim 14, further comprising a carboxylic acid.

16. The slurry composition of claim 14, wherein the pH controlling agent comprises nitric acid.

17. The slurry composition of claim 14, wherein the M-PDTA complex is Fe-PDTA.

18. The slurry composition for chemical-mechanical polishing of metal layer on semiconductor substrates, comprising hydrogen peroxide, nitric acid, malic acid, a silica abrasive in an amount exceeding 8 wt %, a Fe-propylenediaminetetraacetate (Fe-PDTA) complex and deionized water.

* * * * *

UNITED STATES PATENT AND TRADEMARK OFFICE
CERTIFICATE OF CORRECTION

PATENT NO.    : 6,930,054 B2                                         Page 1 of 1
DATED         : August 16, 2005
INVENTOR(S)   : Jae Seok Lee et al.

It is certified that error appears in the above-identified patent and that said Letters Patent is hereby corrected as shown below:

Column 7,
Line 31, change "0.00~5.0 wt %" to -- 0.001~5.0 wt % --.

Column 8,
Line 39, change "metal layer" to -- metal layers --.

Signed and Sealed this

Eleventh Day of October, 2005

JON W. DUDAS
*Director of the United States Patent and Trademark Office*